United States Patent
Li (10) Patent No.: US 8,981,822 B2
(45) Date of Patent: Mar. 17, 2015

(54) HIGH SPEED DUAL MODULUS DIVIDER

(75) Inventor: Shenggao Li, Pleasanton, CA (US)

(73) Assignee: Intel Corporation, Santa Clara, CA (US)

(\*) Notice: Subject to any disclaimer, the term of this patent is extended or adjusted under 35 U.S.C. 154(b) by 5 days.

(21) Appl. No.: 13/619,090

(22) Filed: Sep. 14, 2012

(65) Prior Publication Data

US 2014/0079177 A1    Mar. 20, 2014

(51) Int. Cl.
*H03B 19/00*    (2006.01)
*H03K 21/02*    (2006.01)
*H03K 23/68*    (2006.01)

(52) U.S. Cl.
CPC ............. *H03K 21/023* (2013.01); *H03K 23/68* (2013.01)
USPC ........... 327/117; 327/115; 327/116; 327/119; 713/500

(58) Field of Classification Search
USPC ......... 327/115, 116, 117, 118, 355–361, 202, 327/203, 208–212, 218; 377/47, 48; 455/4
See application file for complete search history.

(56) References Cited

U.S. PATENT DOCUMENTS

| | | | |
|---|---|---|---|
| 5,592,126 A * | 1/1997 | Boudewijns et al. | 331/45 |
| 6,396,312 B1 * | 5/2002 | Shepston et al. | 327/105 |
| 7,002,325 B2 | 2/2006 | Harris et al. | |
| 7,113,048 B2 * | 9/2006 | Brown et al. | 331/57 |
| 7,414,489 B2 * | 8/2008 | Dally et al. | 331/172 |
| 7,477,112 B1 * | 1/2009 | Pi et al. | 331/57 |
| 8,004,335 B2 * | 8/2011 | Kim et al. | 327/231 |
| 8,749,289 B2 | 6/2014 | Li et al. | |
| 2001/0052803 A1 * | 12/2001 | Ozawa | 327/143 |
| 2006/0103478 A1 * | 5/2006 | Brown et al. | 331/57 |
| 2006/0156049 A1 * | 7/2006 | Helio | 713/500 |
| 2007/0090867 A1 * | 4/2007 | Kim | 327/291 |
| 2008/0018367 A1 * | 1/2008 | Bazes | 327/117 |
| 2008/0284476 A1 | 11/2008 | Kwan et al. | |
| 2009/0128198 A1 | 5/2009 | Badets et al. | |
| 2013/0154691 A1 | 6/2013 | Li et al. | |

OTHER PUBLICATIONS

U.S. Appl. No. 13/330,648, filed Dec. 19, 2011.
Li, S., et al., "Clock Generation for a 32nm Server Processor with Scalable Cores," *IEEE International Solid-State Circuits Conference*, Feb. 21, 2011. 2 pages.
PCT/US2013/060419 Notification of Transmittal of the International Search Report and the Written Opinion of the International Searching Authority, or the Declaration, mailed May 29, 2014, 5 pages.
Office Action with English Translation from Corresponding Taiwan Patent Application No. 102216152 mailed Apr. 14, 2014, 5 pages.
Office Action with English Translation from Corresponding Taiwan Patent Application No. 102216152 mailed Sep. 16, 2014, 4 pages.

\* cited by examiner

*Primary Examiner* — Brandon S Cole (74) *Attorney, Agent, or Firm* — Blakely, Sokoloff, Taylor & Zafman LLP (57) ABSTRACT

Described is an apparatus comprising a plurality of logic units arranged in a ring, wherein an output terminal of each logic unit from the plurality of logic units is coupled to an input terminal of a next logic unit from the plurality of logic units, wherein the plurality of logic units includes a first multiple input logic unit having input nodes coupled to at least two output terminals of logic units from the plurality of logic units; and a plurality of latch units coupled to the output terminals of the plurality of logic units.

21 Claims, 6 Drawing Sheets

HIGH SPEED DUAL MODULUS DIVIDER

BACKGROUND

Dividers are used for dividing a frequency of a signal. For example, an output of an oscillator may be divided by a divider into a slower frequency periodic signal relative to the output frequency of the oscillator. Many high performance computing and/or communication systems use on-die system clock frequency with fine resolution, for example, in the order of 10 to 100 Hz. Generally, system clock is generated by a Phase Locked Loop (PLL). The reference input clock for the PLL is generally provided by a fixed frequency crystal oscillator. Since the input frequency of the reference clock is fixed, one way to generate finer system clock frequency is to select a lower reference clock frequency and use an integer divider with as large as possible division ratios to divide the output clock frequency of the PLL to generate a feedback clock signal with same frequency as the reference clock frequency.

However, this method of using integer divider with a large division ratios and lower reference clock frequency limits the design space. For example, generating finer frequency steps in the PLL output clock becomes a challenge. The method and apparatus of using integer divider with large division ratios also causes the system clock's resolution to be limited by the lowest possible reference clock frequency.

When the frequency of the oscillator of the PLL is high, for instance, PLL used for high-speed input-output (I/O) circuits that may be used for inter-chip links, it is non-trivial to design a single-mode divider, let alone dual-modulus dividers.

BRIEF DESCRIPTION OF THE DRAWINGS

Embodiments of the disclosure will be understood more fully from the detailed description given below and from the accompanying drawings of various embodiments of the disclosure, which, however, should not be taken to limit the disclosure to the specific embodiments, but are for explanation and understanding only.

DETAILED DESCRIPTION

In one embodiment, fine frequency resolution may be generated with a fractional divider. For example, the PLL feedback divider ratio may be dynamically modulated so that the average PLL divider ratio can be a fractional number. In one embodiment, the feedback divider may be modulated by a sigma-delta modulator. In one embodiment, the divider is a high speed dual modulus divider (HSDMD) which comprises: a plurality of logic units (e.g., inverters, clock gated NAND and/or NOR gates) arranged in a ring, wherein an output terminal of each logic unit from the plurality of logic units is coupled to an input terminal of a next logic unit from the plurality of logic units, wherein the plurality of logic units includes a first multiple input logic unit (e.g., a clock gated NAND gate or a clock gated NOR gate) having input nodes coupled to at least two output terminals of logic units from the plurality of logic units.

In one embodiment, the HSDMD further comprises a plurality of latch units (e.g., back to back coupled inverters) coupled to the output terminals of the plurality of logic units. In one embodiment, the logic units are gated by complementary clock signals such that successive logic units are gated by alternate complementary clock signals. For example, a first logic unit is gated by clock and clock_b signals (where clock_b is an inverse of clock), and a second logic unit coupled immediately next to the first logic unit is gated by clock_b and clock signals. In one embodiment, the HSDMD is operable to divide the clock signal by N and/or N+1 according to a signal level of a control signal, where 'N' is an integer.

The embodiments discussed herein result in a high speed divider because of its simplified design, low power consumption than current mode logic (CML) based dividers, generates multi-phase clock signals, generates substantially close to 50% duty cycle for the output clock signals, can be used as a fractional divider as well as an integer divider, etc. The embodiments of this disclosure also solve the speed bottle neck of odd-ratio dividers or dual-modulus dividers in high-speed applications, for example, in high speed I/O signaling. Other technical effects will be evident from various embodiments discussed herein.

The term "duty cycle" herein refers to the amount of time a signal is logical high in one period of that signal. For example, a 25% duty cycle means that the signal is logically high 25% of the total period and is logically low 75% of the total signal period. Likewise, a 50% duty cycle means that the signal is logically high for half of the total signal period and logically low for a half of the total signal period.

The term "jitter" herein refers to minimum instantaneous jitter in the clock signal generated by an oscillator. The terms "substantially," "close," "approximately," herein refer to being within +/−20% of a target value.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct electrical connection between the things that are connected, without any intermediary devices. The term "coupled" means either a direct electrical connection between the things that are connected, or an indirect connection through one or more passive or active intermediary devices. The term "circuit" means one or more passive and/or active components that are arranged to cooperate with one another to provide a desired function. The term "signal" means at least one current signal, voltage signal or data/clock signal. The meaning of "a", "an", and "the" include plural references. The meaning of "in" includes "in" and "on."

As used herein, unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For purposes of the embodiments described herein, the transistors are metal oxide semiconductor (MOS) transistors, which include drain, source, gate, and bulk terminals. Source and drain terminals may be identical terminals and are interchangeably used herein. Those skilled in the art will appreciate that other transistors, for example, Bi-polar junction transistors—BJT PNP/NPN, BiCMOS, CMOS, eFET, etc., may be used without departing from the scope of the disclosure. The terms "MN" herein indicates an n-type transistor (e.g., NMOS, NPN BJT, etc) and the term "MP" indicates a p-type transistor (e.g., PMOS, PNP BJT, etc).

Figure 1:
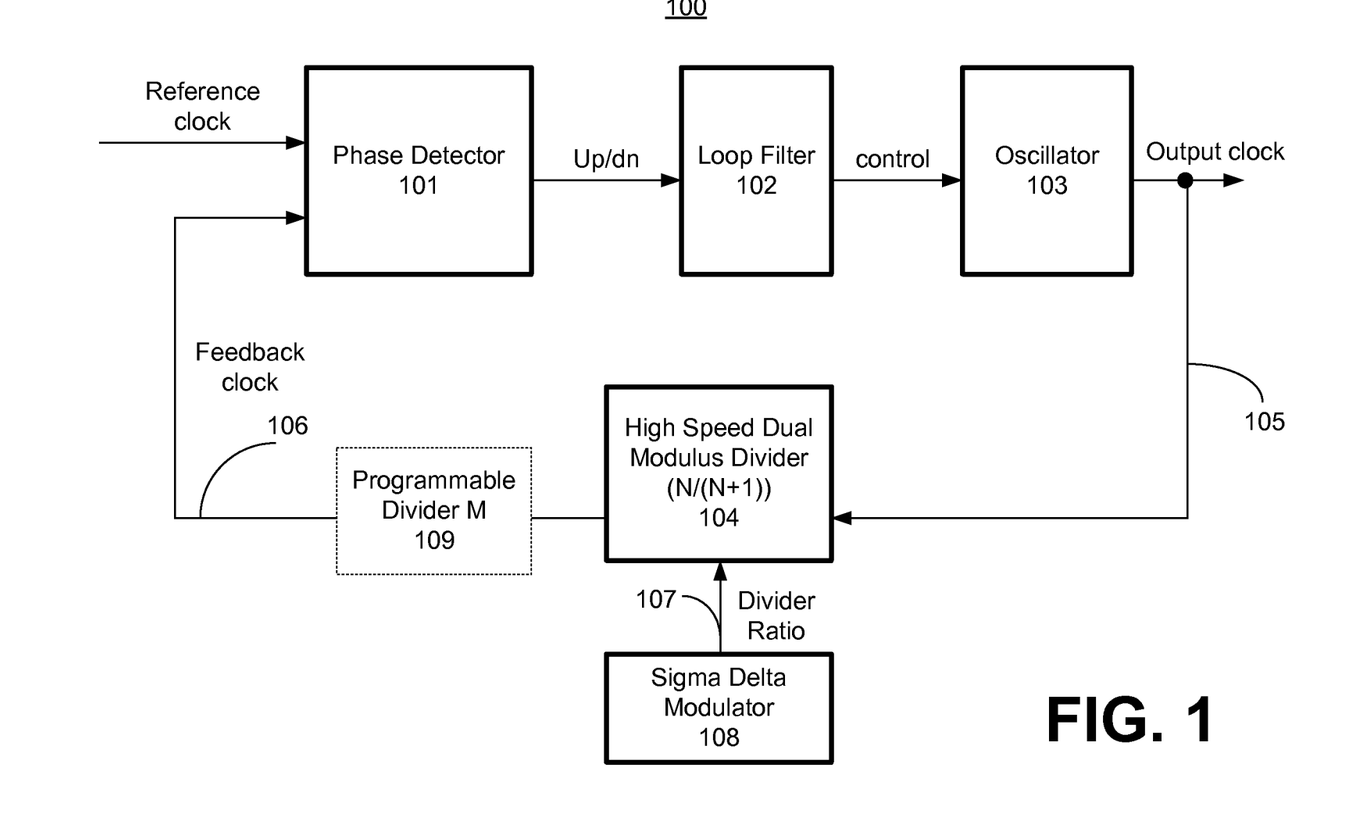
FIG. 1 is a clock generation unit including a high speed dual modulus divider (HSDMD), according to one embodiment of the disclosure.

FIG. 1 is a clock generation unit 100 including a HSDMD 104, according to one embodiment of the disclosure. In one embodiment, the clock generation unit 100 comprises a phase detector 101, a loop filter 102, an oscillator 103, and an HSDMD 104 and/or a programmable 'M' divider 109, where 'M' is an integer. In one embodiment, the programmable divider 109 is operable to combine with the HSDMD 104 to achieve a wider range of frequency programmability. In one embodiment, the programmable 'M' divider 109 is coupled to the phase detector 101 and the HSDMD 104. While the HSDMD 104 is shown as part of the PLL, it can be placed outside of the PLL.

In one embodiment, the clock generation unit 100 is a digital phase locked loop (DPLL). In one embodiment, the clock generation unit 100 is a mixed signal PLL, for example, a self-biased PLL. In other embodiments, other architectures of the PLL may be used with the embodiments of HSDMD 104 discussed herein. So as not to obscure the embodiments, other components of the clock generation unit 100 are not disclosed in detail. The phase detector 101 receives a reference clock and compares with the feedback clock 106 generated by the HSDMD 104 to determine whether the oscillator 103 should operate faster or slower than its previous oscillation speed. The reference clock signal may be generated by a clock crystal oscillation or any other clock signal source.

The phase detector 101 generates an up/down (up/dn) signal indicting the difference in phase (or frequency) of the reference clock and the feedback clock 106. The up/dn signal is then filtered by a loop filter 102. In one embodiment, the loop filter 102 is an analog loop filter with a charge pump and a filter component. In another embodiment, the loop filter 102 is digital loop filter that generates a digital filtered code to control the oscillator. The output of the loop filter 102 is a control signal which is received by the oscillator 103, where the control signal is used to adjust the oscillation frequency of the output clock signal.

In one embodiment, the oscillator 103 is a voltage controlled oscillator (VCO) and the control signal from the loop filter is an analog voltage to control the oscillating frequency of the VCO 103. In another embodiment, the oscillator 103 is a digitally controlled oscillator (DCO) and the control signal from the loop filter is a digital code to adjust the oscillating frequency of the DCO 103.

In one embodiment, the HSDMD 104 receives a clock signal 105 from the oscillator 103 and generates the feedback clock signal 106 according a divider ratio 107. In one embodiment, the divider ratio 107 is at least one of an integer and/or fractional divider ratio. In one embodiment, the HSDMD 104 receives complementary clock signals derived from clock signal 105, wherein the complementary clock signals include clock (CK) and clock_b (CKB) signals, where CKB is an inverse of CK. In one embodiment, the HSDMD 104 generates multi-phase clock signals.

So as not to obscure the embodiments of the disclosure, the HSDMD 104 discussed herein is operable to divide the clock signal (CK) 105 by 2, by 3, and by ⅔. The concepts discussed herein can be used for implementing any divider size i.e., a divider that can divide by 'N' and/or "N+1," where 'N' is an integer.

In one embodiment, the clock generation system 100 includes a sigma-delta modulator 108 that provides the divider ratio 107 and other signals (not shown). In one embodiment, the sigma-delta modulator 108 modulates the divider ratio 107 signal to cause the HSDMD 104 to operate as a fractional divider. For example, the sigma-delta modulator 108 may dither between divide-by-two and divide-by-three options (which is information indicated by the divider ratio signal 107) to cause the HSDMD 104 to divide by ⅔.

In one embodiment, the sigma delta modulator 108 controls the HSDMD 104 to function as a fractional divider. For instance, over a given period of time, the HSDMD 104 is configured to a divider ratio 107 of 'N' for X % of the total time, and then a divider ratio 107 of "N+1" for 1–X % of the total time. In such an embodiment, the divider ratio is expressed as N*X %+(N+1)*(1–X %).

In one embodiment, when X=0, the effective divider ratio is "N+1," and when X=100, the effective divider ratio is 'N.' In one embodiment, any fractional ratio in between 'N' and "N+1" is programmable through X. In one embodiment, the sigma delta modulator 108 randomizes the control sequence of the divider ratio 107. In such an embodiment, the PLL may not suffer from strong reference spurs which are otherwise detrimental to the PLL spectrum purity.

Figure 2:
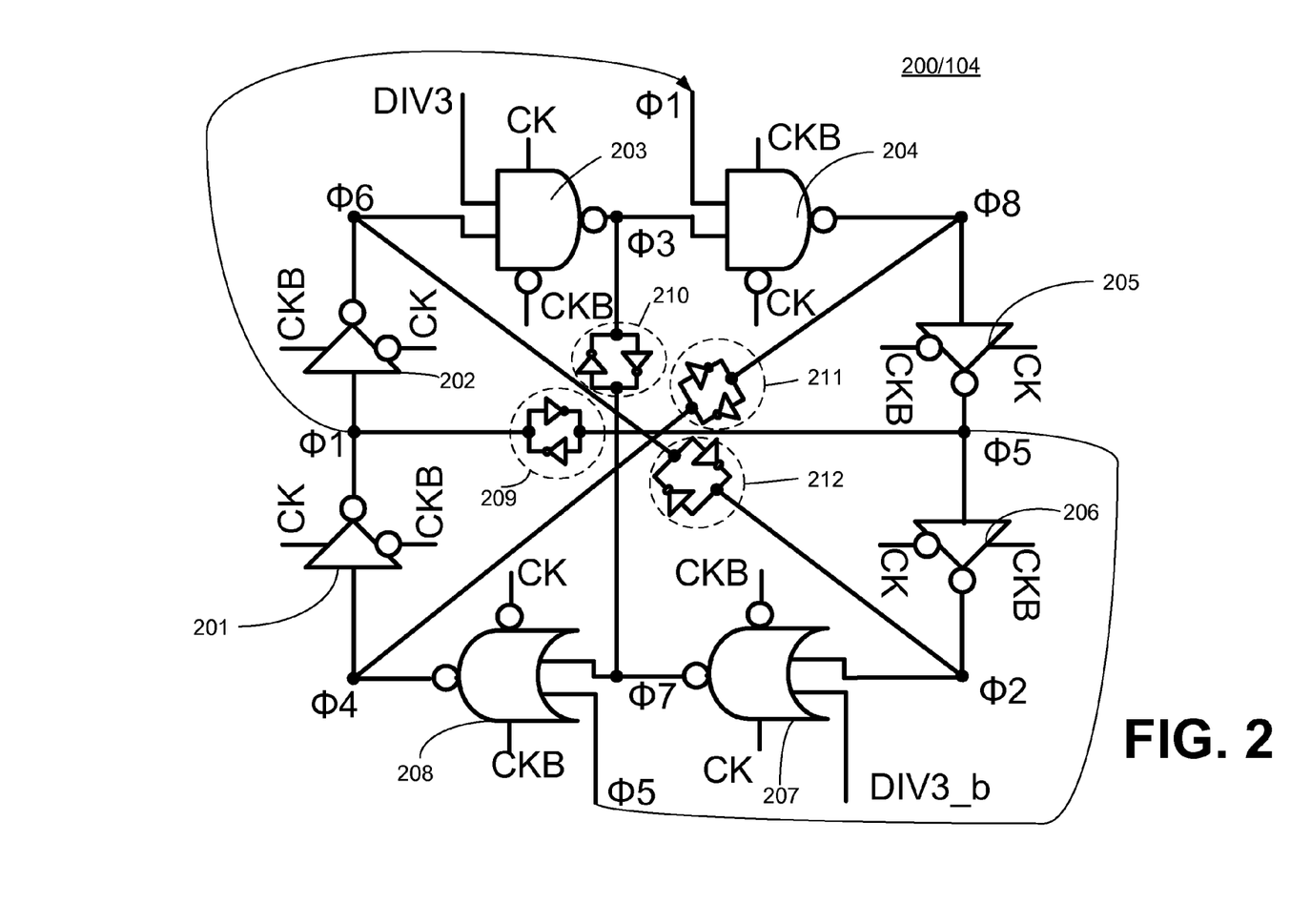
FIG. 2 is an HSDMD, according to one embodiment of the disclosure.

FIG. 2 is an HSDMD 200/104, according to one embodiment of the disclosure. In one embodiment, the HSDMD 200/104 comprises a plurality of logic units arranged in a ring such that the output of one logic unit is received as input to the next logic unit. In one embodiment, the plurality of logic units includes clock gated inverters 201, 202, 205, and 206, clock gated NAND gates 203 and 204, and clock-gated NOR gates 207 and 208, coupled together as shown.

In one embodiment, each of the plurality of logic units receives complementary clock signals CK and CKB to control the output of the respective logic units. In one embodiment, successive logic units receive alternate complementary clock signals CK and CKB. For example, inverter 201 receives CK and CKB signals while inverter 202 which is a successive inverter to inverter 201 receives CKB and CK instead of CK and CKB at the same terminals. In such an embodiment, when inverter 201 is operating as an inverter, inverter 202 is gated by the CK and CKB signals and so its output is maintained with its previous value because the inverter 202 is not driving any signal. In one embodiment, the output of each logic unit from the plurality of logic units is a clock phase signal i.e., Φ1-Φ8, representing eight phases.

In one embodiment, the plurality of logic units includes a first clock gated NAND gate 203 which receives an output Φ6 from the inverter 202 and a control signal "DIV3" for selecting a divider mode. In one embodiment, the plurality of logic units include a second clock gated NAND gate 204 which receives output Φ3 from the first NAND gate 203 and output Φ1 of the inverter 201.

In one embodiment, the plurality of logic units includes a first clock gated NOR gate 207 which receives an output Φ2 from the inverter 206 and a control signal "DIV 3_b" (inverse of "DIV3") for selecting the divider mode. In one embodiment, the signals DIV3 and/or DIV3_b are the divider ratio signal(s) 107 generated by the sigma delta modulator 108. In one embodiment, the divider ratio signal 107 comprises a plurality of bits to cause the HSDMD 200/104 to behave as a complex multi-modulus divider, for example, N/N+1/N+2/N+3, etc. In one embodiment, the divider ratio is averaged over N, N+1, N+2, N+3, etc depending on the output of the sigma delta modulator 108. In one embodiment, the plurality of logic units includes a second clock gated NOR gate 208 which receives output Φ7 from the first NOR gate 207 and output Φ5 of the inverter 205.

In one embodiment, the HSDMD 200/104 comprises a plurality of latches 209, 210, 211, and 212 coupled to output nodes of the plurality of logic units as shown. In one embodiment, the plurality of latches 209, 210, 211, and 212 may force the ring structure of the HSDMD 200/104 to follow the state transition states of FIG. 4A. Without the latches, the ring may fall in a state which may deadlock to itself. Referring back to FIG. 2, in one embodiment each of the plurality of latches 209 comprises back-to-back coupled inverters. In other embodiments, other forms of latches or sequential units may be used.

In one embodiment, latch 209 is coupled to the outputs Φ5 and Φ1 of inverters 205 and 201 respectively. In one embodiment, latch 210 is coupled to the outputs Φ3 and Φ7 of NAND gate 203 and NOR gate 207 respectively. In one embodiment, latch 211 is coupled to the outputs Φ8 and Φ4 of NAND gate 204 and NOR gate 208 respectively. In one embodiment, latch 212 is coupled to the outputs Φ2 and Φ6 of inverters 206 and 202 respectively.

In one embodiment, when the control signal DIV3 is logical 0 and DIV3_b is logical 1, the HSDMD 200/104 operates in divide-by-two mode. In one embodiment, when the control signal DIV3 is logical 1 and DIV3_b is logical 0, the HSDMD 200/104 operates in divide-by-three mode. In one embodiment, the DIV3 and/or DIV3_b are generated by the sigma-delta modulator 108.

Figures 3A, 3B:
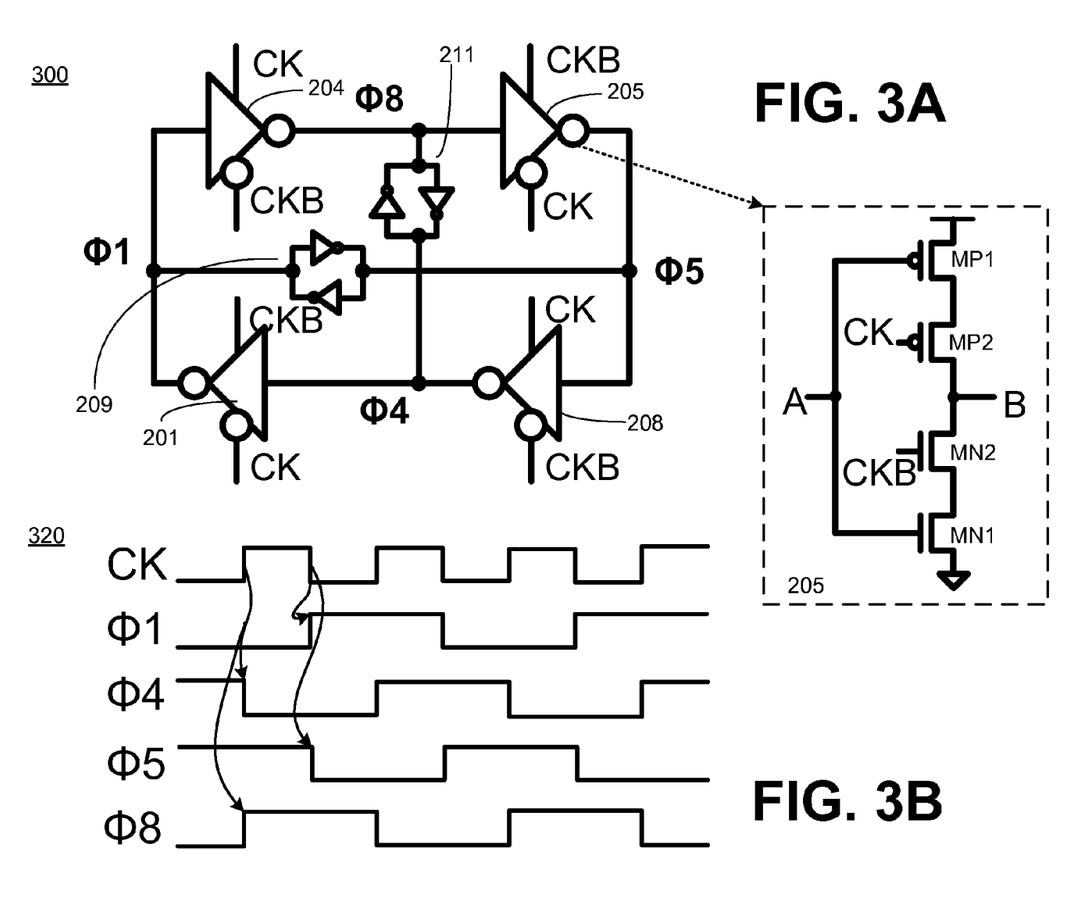
FIG. 3A is the operational portion of the HSDMD in divide-by-two mode, according to one embodiment of the disclosure.
FIG. 3B is a timing diagram of the operational portion of the HSDMD of FIG. 3A, according to one embodiment of the disclosure.

FIG. 3A is the operational portion 300 of the HSDMD 200/104 in divide-by-two mode, according to one embodiment of the disclosure. In this embodiment, DIV3 is logical 0 which causes the first NAND gate 203 to force a logical 1 on Φ3. In such an embodiment, DIV3_b is logical 1 because it is inverse of DIV3 which causes the first NOR gate 207 to force Φ7 to logical 0. In such an embodiment, a 4-stage circular structure is formed from Φ1→Φ8→Φ5→Φ4 and back to Φ1 as shown.

In the embodiment of FIG. 3A, the second NAND gate 204 operates as an inverter because one of its inputs is forced to logical 0 by the first NAND gate 203. The second NOR gate 208 also operates as an inverter because one of its inputs is forced to logical 1 by the first NOR gate 207. In one embodiment, latch 211 forces an inverted logical value of Φ8 on Φ4, and an inverted logical value of Φ4 on Φ8. In one embodiment, latch 209 forces an inverted logical value of Φ1 on Φ5, and an inverted logical value of Φ5 on Φ1.

An exemplary embodiment of the gated inverter circuit of inverter 205 is shown as an expanded view comprising n-type transistors MN1 and MN2 coupled in series with p-type transistors MP1 and MP2, where the gating function is performed by MN2 and MP2. The input is received by MP1 and MN1 while 'B' is the output. In another embodiment (not shown), the gated inverter circuit of inverter 205 comprises a regular inverter with two transistors (a p-type and an n-type) coupled in series with 'A' as the input to the transistors (input received at the gates) while 'B' being an internal output which is coupled to a transmission gate controlled by CK and CKB. In such an embodiment, the output of the transmission gate is the final output of the gated inverter circuit 205.

In other embodiments, other circuit topologies may be used to implement a gated inverter structure. For example, a clock-gated NAND gate with one of its inputs tied to logical 0 may be used to implement a gated inverter. In another example, a clock-gated NOR gate with one of its inputs tied to logical 1 may be used to implement a gated inverter.

FIG. 3B is a timing diagram 320 of the operational portion of the HSDMD 200/104 of FIG. 3A, according to one embodiment of the disclosure. As shown in the timing diagram 320, Φ1, Φ4, Φ5, and Φ8 have half the frequencies of the clock signal CK, where Φ8 is substantially phase aligned with CK. Here, Φ8 has a substantially 50% duty cycle. This embodiment illustrates a divide-by-two mode operation of the HSDMD 200/104.

Figure 4A:
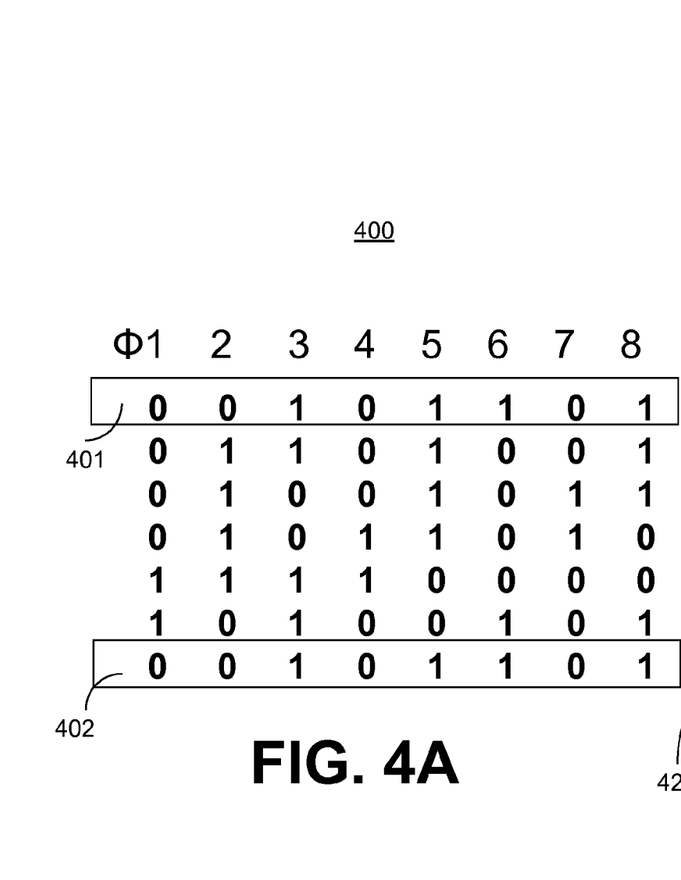
FIG. 4A is a transition table of the operational portion of the HSDMD in divide-by-three mode, according to one embodiment of the disclosure.

FIG. 4A is a Transition Table 400 of the operational portion of the HSDMD 200/104 in divide-by-three mode, according to one embodiment of the disclosure. In this embodiment, DIV3 is logical 1 which causes the first NAND gate 203 to behave as an inverter. In this embodiment, the first NOR gate 207 receives a logical 0 as its input (DIV3_b is an inverse of DIV3) which causes the NOR gate 207 to operate as an inverter. The ring comprising the logic units in 200/104 form a divide-by-three divider.

The Table 400 shows 8 rows and 8 columns. The first row includes the output nodes of each logic unit in the ring forming the HSDMD 200/104. Second row 401 through the last row 402 illustrates the change in logical states of the output nodes of each logic unit on every falling and rising edges of the clock CK cycle.

For example, the second row 401 illustrates the states of the output nodes Φ1-Φ8 after the falling transition of the clock CK. The third row illustrates the states of the output nodes Φ1-Φ8 after the rising transition of the clock CK. On the eighth row 402, the states of the output nodes Φ1-Φ8 repeats with reference to the states in the second row 401.

In the example of FIG. 4A, the initial states of Φ1-Φ8 start from 00101101 (row 401). When CK transitions from logical 1 to logical 0 i.e., CKB transitions from logical 0 to logical 1, the output states of Φ1-Φ8 move from the second row (402) to the third row, and becomes 01101001. In the next CK transition from logical 0 to logical 1, the output states of Φ1-Φ8 moves from the third row to the fourth row, and so on. In this example, after six transitions of CK, the output states of Φ1-Φ8 become 00101101 (last row 402) again. Namely, for every 3 input CK cycles, the output states repeat. Hence, the circuit implements a divide-by-3 frequency divider when DIV3 is set to logical 1.

Figure 4B:
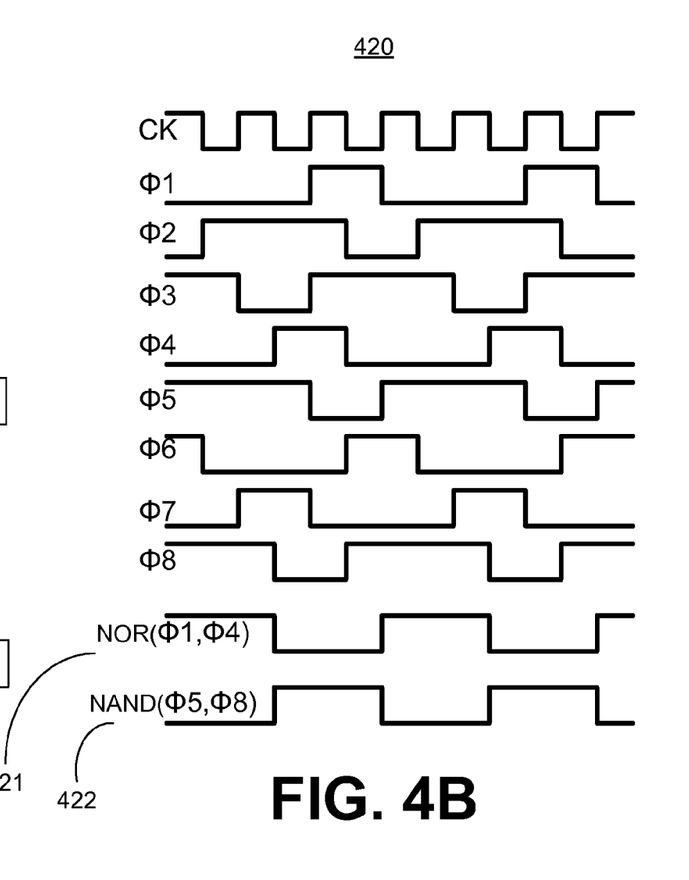
FIG. 4B is a timing diagram of the operational portion of the HSDMD in divide-by-three mode of FIG. 4A, according to one embodiment of the disclosure.

FIG. 4B is a timing diagram 420 of the operational portion of the HSDMD 200/104 in divide-by-three mode of FIG. 4A, according to one embodiment of the disclosure. The waveforms of Φ1-Φ8 correspond to the logical states in each row for every CK transition. The Φ1-Φ8 waveforms are not symmetrical and have a duty cycle ratio of around 2:4. In one embodiment, this DC (direct current) imbalance due to unsymmetrical waveforms Φ1-Φ8 is corrected by applying a NAND operation on two neighboring output nodes of HSDMD 200/104 as shown by waveform 421. In another embodiment, the DC imbalance due to unsymmetrical waveforms Φ1-Φ8 is corrected by applying a NOR operation on two neighboring output nodes of HSDMD 200/104 as shown by waveform 422.

For example, applying NOR(Φ1, Φ4) operation, where Φ1 and Φ4 are inputs to the NOR gate, provides near 50% duty cycle at the output 422 of the NOR gate. In another example, applying NAND(Φ5, Φ8) operation, where Φ5 and Φ8 are inputs to the NAND gate, provides near 50% duty cycle at the output 421 of the NAND gate. The near 50% duty cycle generation may be required for many clock generation and distribution systems in order to prevent pulse evaporation. In another example, NOR operation may be applied to Φ2 and Φ5 to generate a near 50% duty cycle at the output of the NOR gate.

Figure 5A:
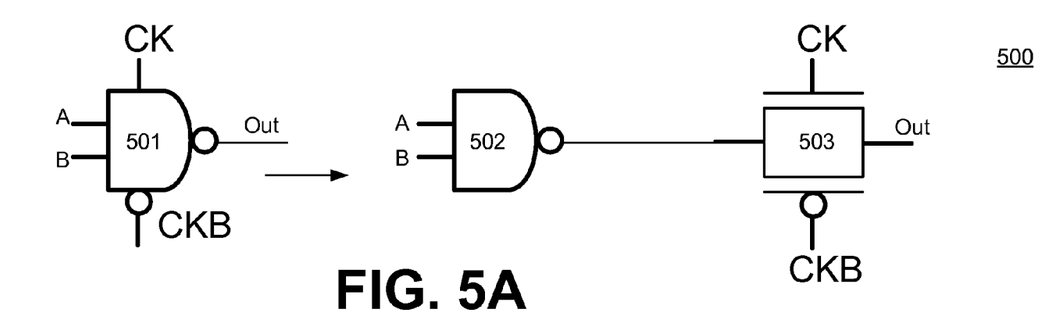
FIG. 5A is a clock gated NAND gate for the HSDMD, according to one embodiment of the disclosure.

FIG. 5A is a clock-gated NAND gate 500 for the HSDMD 200/104, according to one embodiment of the disclosure. In this embodiment, the clock gating and NAND function of the NAND gate 501 is implemented by coupling a transmission gate 503 to the output of a regular NAND gate 502. In this embodiment, the gates of the transmission gate 503 are coupled to CK and CKB as shown.

Figure 5B:
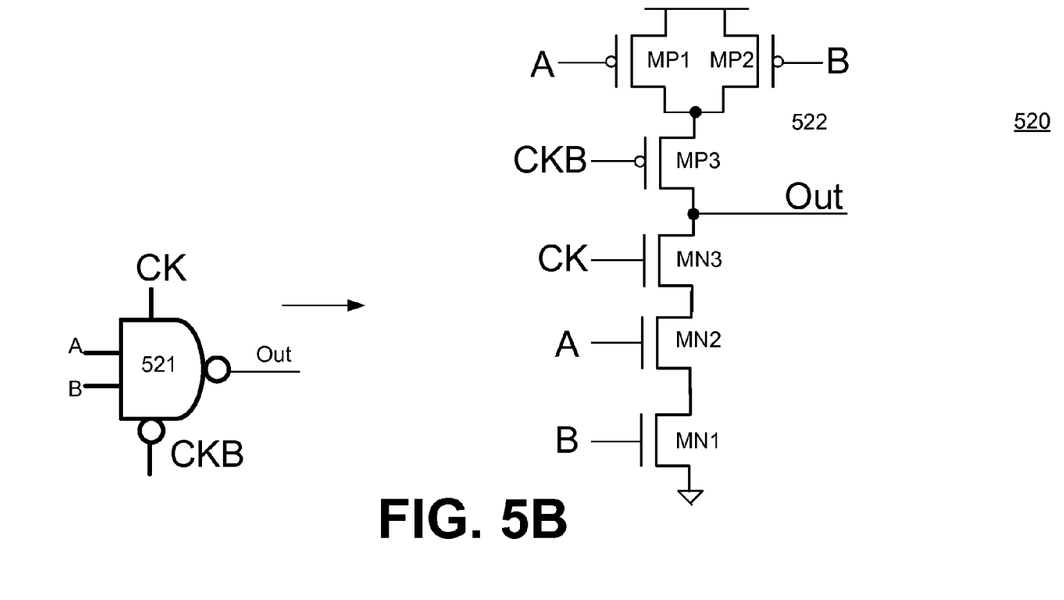
FIG. 5B is a clock gated NAND gate for the HSDMD, according to another embodiment of the disclosure.

FIG. 5B is a clock-gated NAND gate 520 for the HSDMD 200/104, according to another embodiment of the disclosure. In this embodiment, the clock gating and NAND function of the NAND gate 521 is integrated within a NAND circuit topology as shown by 522. In this embodiment, the gated NAND gate 522 comprises n-type transistors MN1, MN2, and MN3 coupled to the p-type transistors MP1, MP2, and MP3 as shown. The clock gating function is performed by MN3 and MP3 while MP1, MP2, MN1 and MN2 provide the NAND function. Similar circuit topologies as illustrated in FIG. 5A and FIG. 5B may also be used for implementing clock-gated NOR gates.

Figure 6:
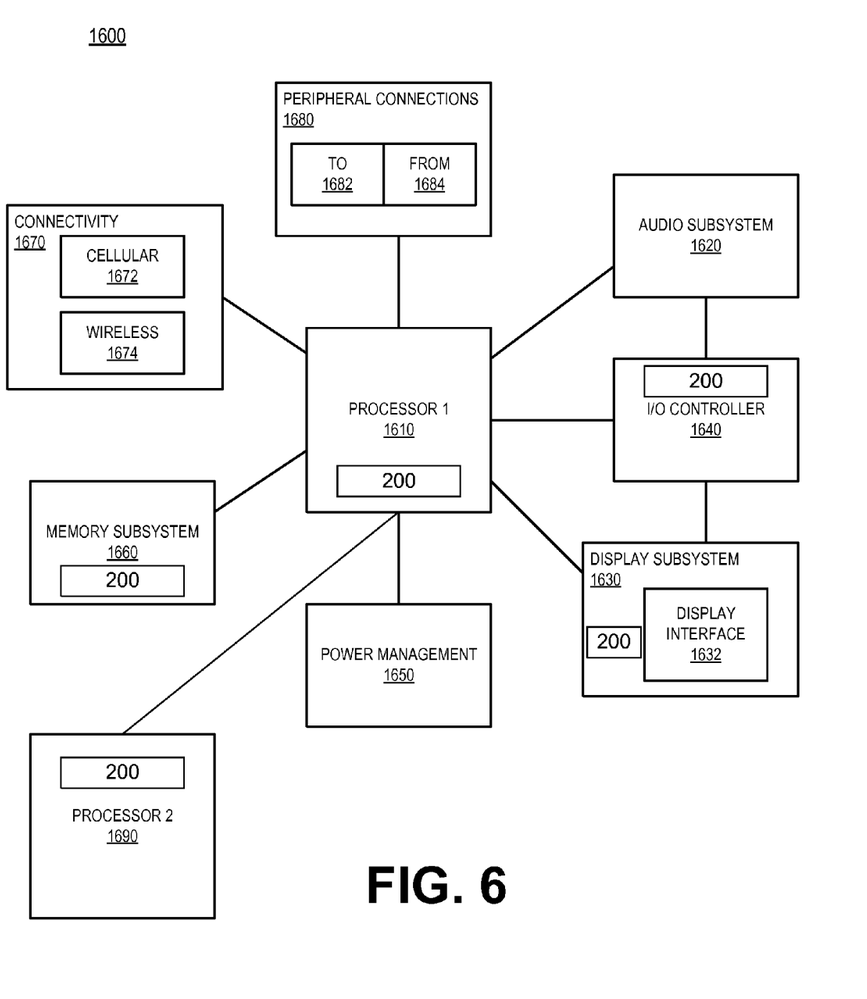
FIG. 6 is a system-level diagram of a smart device comprising a processor with the HSDMD, according to one embodiment of the disclosure.

FIG. 6 is a system-level diagram of a smart device 1600 (also referred herein as a computing device) comprising a processor with the HSDMD 200/104, according to one embodiment of the disclosure. FIG. 6 also illustrates a block diagram of an embodiment of a mobile device in which flat surface interface connectors could be used. In one embodiment, the computing device 1600 represents a mobile computing device, such as a computing tablet, a mobile phone or smart-phone, a wireless-enabled e-reader, or other wireless mobile device. It will be understood that certain components are shown generally, and not all components of such a device are shown in device 1600.

In one embodiment, the computing device 1600 includes a first processor 1610 with the HSDMD 200/104 and a second processor 1690 with the HSDMD 200/104, according to the embodiments discussed herein. The various embodiments of the present disclosure may also comprise a network interface within 1670 such as a wireless interface so that a system embodiment may be incorporated into a wireless device, for example, cell phone or personal digital assistant.

In one embodiment, the processor 1610 can include one or more physical devices, such as microprocessors, application processors, microcontrollers, programmable logic devices, or other processing means. The processing operations performed by processor 1610 include the execution of an operating platform or operating system on which applications and/or device functions are executed. The processing operations include operations related to I/O (input/output) with a human user or with other devices, operations related to power management, and/or operations related to connecting the computing device 1600 to another device. The processing operations may also include operations related to audio I/O and/or display I/O.

In one embodiment, the computing device 1600 includes audio subsystem 1620, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into device 1600, or connected to the computing device 1600. In one embodiment, a user interacts with the computing device 1600 by providing audio commands that are received and processed by processor 1610.

Display subsystem 1630 represents hardware (e.g., display devices) and software (e.g., drivers) components that provide a visual and/or tactile display for a user to interact with the computing device. Display subsystem 1630 includes display interface 1632, which includes the particular screen or hardware device used to provide a display to a user. In one embodiment, display interface 1632 includes logic separate from processor 1610 to perform at least some processing related to the display. In one embodiment, display subsystem 1630 includes a touch screen (or touch pad) device that provides both output and input to a user.

I/O controller 1640 represents hardware devices and software components related to interaction with a user. I/O controller 1640 is operable to manage hardware that is part of audio subsystem 1620 and/or display subsystem 1630. Additionally, I/O controller 1640 illustrates a connection point for additional devices that connect to device 1600 through which a user might interact with the system. For example, devices that can be attached to the computing device 1600 might include microphone devices, speaker or stereo systems, video systems or other display device, keyboard or keypad devices, or other I/O devices for use with specific applications such as card readers or other devices.

As mentioned above, I/O controller 1640 can interact with audio subsystem 1620 and/or display subsystem 1630. For example, input through a microphone or other audio device can provide input or commands for one or more applications or functions of the computing device 1600. Additionally, audio output can be provided instead of, or in addition to display output. In another example, if display subsystem includes a touch screen, the display device also acts as an input device, which can be at least partially managed by I/O controller 1640. There can also be additional buttons or switches on the computing device 1600 to provide I/O functions managed by I/O controller 1640.

In one embodiment, the I/O controller 1640 manages devices such as accelerometers, cameras, light sensors or other environmental sensors, or other hardware that can be included in the computing device 1600. The input can be part of direct user interaction, as well as providing environmental input to the system to influence its operations (such as filtering for noise, adjusting displays for brightness detection, applying a flash for a camera, or other features).

In one embodiment, the computing device 1600 includes power management 1650 that manages battery power usage, charging of the battery, and features related to power saving operation. Memory subsystem 1660 includes memory devices for storing information in device 1600. Memory can include nonvolatile (state does not change if power to the memory device is interrupted) and/or volatile (state is indeterminate if power to the memory device is interrupted)

memory devices. Memory 1660 can store application data, user data, music, photos, documents, or other data, as well as system data (whether long-term or temporary) related to the execution of the applications and functions of the computing device 1600.

Elements of embodiments are also provided as a machine-readable medium (e.g., memory 1660) for storing the computer-executable instructions (e.g., instructions to implement any other processes discussed herein). The machine-readable medium (e.g., memory 1660) may include, but is not limited to, flash memory, optical disks, CD-ROMs, DVD ROMs, RAMs, EPROMs, EEPROMs, magnetic or optical cards, or other type of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

Connectivity 1670 includes hardware devices (e.g., wireless and/or wired connectors and communication hardware) and software components (e.g., drivers, protocol stacks) to enable the computing device 1600 to communicate with external devices. The device 1600 could be separate devices, such as other computing devices, wireless access points or base stations, as well as peripherals such as headsets, printers, or other devices.

Connectivity 1670 can include multiple different types of connectivity. To generalize, the computing device 1600 is illustrated with cellular connectivity 1672 and wireless connectivity 1674. Cellular connectivity 1672 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity 1674 refers to wireless connectivity that is not cellular, and can include personal area networks (such as Bluetooth, Near Field, etc), local area networks (such as Wi-Fi), and/or wide area networks (such as WiMax), or other wireless communication.

Peripheral connections 1680 include hardware interfaces and connectors, as well as software components (e.g., drivers, protocol stacks) to make peripheral connections. It will be understood that the computing device 1600 could both be a peripheral device ("to" 1682) to other computing devices, as well as have peripheral devices ("from" 1684) connected to it. The computing device 1600 commonly has a "docking" connector to connect to other computing devices for purposes such as managing (e.g., downloading and/or uploading, changing, synchronizing) content on device 1600. Additionally, a docking connector can allow device 1600 to connect to certain peripherals that allow the computing device 1600 to control content output, for example, to audiovisual or other systems.

In addition to a proprietary docking connector or other proprietary connection hardware, the computing device 1600 can make peripheral connections 1680 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other type.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented i.e., such specifics should be well within purview of one skilled in the art. Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described herein may also be implemented with respect to a method or process.

For example, in one embodiment, an apparatus comprises: a plurality of logic units arranged in a ring, wherein an output terminal of each logic unit from the plurality of logic units is coupled to an input terminal of a next logic unit from the plurality of logic units, wherein the plurality of logic units includes a first multiple input logic unit having input nodes coupled to at least two output terminals of logic units from the plurality of logic units; and a plurality of latch units coupled to the output terminals of the plurality of logic units.

In one embodiment, the plurality of logic units includes a second multiple input logic unit having input nodes coupled to an output terminal of a logic unit from the plurality of logic units and to a control signal. In one embodiment, the control signal to select a divider ratio. In one embodiment, the first and second multiple input logic units comprise at least one of: a clock gated NAND gate, or a clock gated NOR gate. In one embodiment, the at least two output terminals are from different logic units from the plurality of logic units. In one embodiment, each logic unit is operable to invert data it receives at its input.

In one embodiment, each logic unit from the plurality of logic units to receive complementary clock signals at respective first and second clock terminals. In one embodiment, the complementary clock signals are generated directly or indirectly from an oscillator. In one embodiment, the successive logic units from the plurality of logic units to receive alternate complementary clock signals at respective first and second clock terminals.

In one embodiment, each latch unit from the plurality of latch units includes a pair of back-to-back coupled inverters. In one embodiment, the apparatus further comprises a sigma-delta modulator to generate an output signal received by at least one of the logic units from the plurality of logic units. In one embodiment, the apparatus further comprises one of a NOR gate or a NAND gate to receive outputs of the plurality of logic units to generate a substantially 50% duty cycle signal.

In another example, a divider comprises: a plurality of logic units, arranged in a ring, including: a gated inverter; a gated NAND gate; and a gated NOR gate; and a plurality of latch units coupled to outputs of some of the plurality of logic units. In one embodiment, the gated NAND gate to receive an output of the gated inverter and an output of another gated NAND gate. In one embodiment, the gated NOR gate to receive an output of the gated inverter and an output of another gated NOR gate. In one embodiment, the gated inverter, NAND gate, and NOR gate to receive complementary clock signals at their respective first and second clock terminals. In one embodiment, the plurality of latch units includes back-to-back coupled inverters.

In another example, a system comprises: a memory (e.g., DRAM, SRAM); a processor coupled to the memory, the processor having a divider including: a plurality of logic units arranged in a ring, wherein an output terminal of each logic unit from the plurality of logic units is coupled to an input terminal of a next logic unit from the plurality of logic units, wherein the plurality of logic units includes a first multiple input logic unit having input nodes coupled to at least two output terminals; and a plurality of latch units coupled to output terminals of the logic units; and a wireless interface to allow the processor to communicate with another device. In one embodiment, the system further comprises a display unit. In one embodiment, the divider is part of a clock generation system. In one embodiment, the plurality of logic units includes a second multiple input logic unit having input nodes coupled to an output of a logic unit from the plurality of logic units and to a control signal.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

I claim:

1. An apparatus comprising:
 a plurality of logic units arranged in a ring, wherein an output terminal of each logic unit from the plurality of logic units is coupled to an input terminal of a next logic unit from the plurality of logic units, wherein the plurality of logic units includes a first multiple input logic unit having input nodes coupled to at least two output terminals of logic units from the plurality of logic units, and wherein the first multiple input logic unit comprises at least one of a clock gated NAND gate or a clock gated NOR gate; and
 a plurality of latch units coupled to the output terminals of the plurality of logic units.

2. The apparatus of claim 1, wherein the plurality of logic units includes a second multiple input logic unit having input nodes coupled to an output terminal of a logic unit from the plurality of logic units and to a control signal.

3. The apparatus of claim 2, wherein the control signal to select a divider ratio.

4. The apparatus of claim 2, wherein the second multiple input logic unit comprises at least one of:
 a clock gated NAND gate, or
 a clock gated NOR gate.

5. The apparatus of claim 1, wherein the at least two output terminals are from different logic units from the plurality of logic units.

6. The apparatus of claim 1, wherein each logic unit is operable to invert data it receives at its input.

7. The apparatus of claim 1, wherein each logic unit from the plurality of logic units to receive complementary clock signals at respective first and second clock terminals.

8. The apparatus of claim 1, wherein the complementary clock signals are generated directly or indirectly from an oscillator.

9. The apparatus of claim 1, wherein successive logic units from the plurality of logic units to receive alternate complementary clock signals at respective first and second clock terminals.

10. The apparatus of claim 1, wherein each latch unit from the plurality of latch units includes a pair of back-to-back coupled inverters.

11. The apparatus of claim 1 further comprises a sigma-delta modulator to generate an output signal received by at least one of the logic units from the plurality of logic units.

12. The apparatus of claim 1, wherein the at least one a NOR gate or a NAND gate is to generate a substantially 50% duty cycle signal.

13. A divider comprising:
 a plurality of logic units, arranged in a ring, including:
  a gated inverter;
  a gated NAND gate; and
  a gated NOR gate; and
 a plurality of latch units coupled to outputs of some of the plurality of logic unit;
 wherein at least one of the gated NAND gate or the gated NOR gate is clock gated and is further coupled to at least two output terminals of logic units from the plurality of logic units.

14. The divider of claim 13, wherein the gated NAND gate to receive an output of the gated inverter and an output of another gated NAND gate.

15. The divider of claim 13, wherein the gated NOR gate to receive an output of the gated inverter and an output of another gated NOR gate.

16. The divider of claim 13, wherein the gated inverter, NAND gate, and NOR gate to receive complementary clock signals at their respective first and second clock terminals.

17. The divider of claim 13, wherein the plurality of latch units includes back-to-back coupled inverters.

18. A system comprising:
 a memory;
 a processor coupled to the memory, the processor having a divider including:
  a plurality of logic units arranged in a ring, wherein an output terminal of each logic unit from the plurality of logic units is coupled to an input terminal of a next logic unit from the plurality of logic units, wherein the plurality of logic units includes a first multiple input logic unit comprising at least one of a clock gated NAND gate or a clock gated NOR gate having input nodes further coupled to at least two output terminals; and a plurality of latch units coupled to output terminals of the logic units; and a wireless interface to allow the processor to communicate with another device.

19. The system of claim 18 further comprises a display unit.

20. The system of claim 18, wherein the divider is part of a clock generation system.

21. The system of claim 18, wherein the plurality of logic units includes a second multiple input logic unit having input nodes coupled to an output of a logic unit from the plurality of logic units and to a control signal.

* * * * *